United States Patent
Berger et al.

(12)

(10) Patent No.: US 6,340,630 B1
(45) Date of Patent: Jan. 22, 2002

(54) METHOD FOR MAKING INTERCONNECT FOR LOW TEMPERATURE CHIP ATTACHMENT

(75) Inventors: Daniel George Berger, Wappingers Falls, NY (US); Guy Paul Brouillette, Daudelin; David Hirsch Danovitch, Des Aigles, both of (CA); Peter Alfred Gruber, Mohegan Lake, NY (US); Bruce Lee Humphrey, Jericho, VT (US); Michael Liehr, Yorktown Heights, NY (US); William Thomas Motsiff, Essex Junction, VT (US); Carlos Juan Sambucetti, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/536,557

(22) Filed: Mar. 28, 2000

Related U.S. Application Data

(62) Division of application No. 08/710,992, filed on Sep. 25, 1996, now Pat. No. 6,127,735.

(51) Int. Cl.[7] .................................................. A01L 21/44
(52) U.S. Cl. ...................... 438/613; 438/612; 438/614; 438/616
(58) Field of Search ................................. 435/612, 613, 435/614, 615, 616

(56) References Cited

U.S. PATENT DOCUMENTS

| | | | | |
|---|---|---|---|---|
| 3,512,051 A | * | 5/1970 | Noll ............................ | 257/778 |
| 4,505,029 A | * | 3/1985 | Owyang et al. ............ | 438/614 |
| 5,143,865 A | * | 9/1992 | Hideshima et al. ......... | 438/614 |
| 5,860,585 A | * | 1/1999 | Rutledge et al. ............ | 438/616 |

* cited by examiner

Primary Examiner—Kevin M. Picardat
(74) Attorney, Agent, or Firm—Robert M. Trepp

(57) ABSTRACT

A method of forming interconnects on an electronic device that can be bonded to another electronic device at a low processing temperature can be carried out by depositing a first interconnect material on the electronic device forming protrusions and then depositing a second interconnect material to at least partially cover the protrusions, wherein the second interconnect material has a lower flow temperature than the first interconnect material. The method is carried out by flowing a molten solder into a mold having microcavities to fill the cavities and then allowed to solidify. The mold is then aligned with a silicon wafer containing chips deposited with high melting temperatures solder bumps such that each microcavity of the mold is aligned with each high melting temperature solder bump on the chip. The aligned mold/wafer assembly is then passed through a reflow furnace to effect the transfer of the low melting temperature solder in the mold cavities onto the tip of the high melting temperature solder bumps on the wafer. A dual metallurgical composition bump is thereby formed by the two different solder alloys.

18 Claims, 2 Drawing Sheets

METHOD FOR MAKING INTERCONNECT FOR LOW TEMPERATURE CHIP ATTACHMENT

This is a divisional of application Ser. No. 08/710,992 filed on Sep. 25, 1996, now U.S. Pat. No. 6,127,735.

FIELD OF THE INVENTION

The present invention generally relates to a method for making interconnect on an electronic structure and the structure made and more particularly, relates to a method for making electronic device made by such method.

BACKGROUND OF THE INVENTION

In the present semiconductor fabrication process, semiconductor chips are frequently attached to other chips or other electronic structures. The attachment of the chip is frequently accomplished by one of two different techniques. The first is a wire bonding process in which each of a series of I/O bump terminal on a chip built on an aluminum bonding pad is sequentially bonded to the connecting pads on a substrate. The second technique is a flip chip attachment method in which all the I/O bumps on the semiconductor chip are first terminated with a solder material. A frequently used solder material is a 97% lead/3% tin high melting temperature solder alloy. The semiconductor chip is then flipped over and the solder bumps are aligned and reflowed in a reflow furnace to effect all the I/O connections with the bonding pads on the substrate. One advantage achieved by the flip chip process is its applicability to very high density CMOS circuits and its high reliability in the interconnects formed when compared to the wire bonding process. The latter technique also has limitations in the number of I/O interconnections that can be made in high performance devices. One of the disadvantages of the flip chip process is that the process was originally designed for a high temperature bonding process and thus the solder bump material chosen for mechanical and electrical reliability is a high melting temperature lead/tin solder. The high melting temperature solder can only be bonded by reflowing the solder at above 350° C. and therefore, limiting the process of bonding to high temperature substrates such as ceramic and the like. Others have attempted to find solutions to overcome this problem, for instance, by using alternative solder alloys that have lower melting temperatures. Even though most of the lower melting temperature alloys do not meet the reliability requirement for high performance, high density circuits.

One solution proposed by others for performing a direct chip attach of a chip to a card with high melting temperature lead/tin solder bumps is to pre-deposit a low temperature solder on the card prior to the chip attach. Others have attempted the process of evaporating additional tin cap onto the high temperature solder bump. Both techniques introduce added costs and cards with more complex structure. For instance, the first technique requires that molten solder be injected through patterned openings in a mask so that they can be deposited at the desired pad locations on a substrate. The injection process is relatively complex which leads to a higher fabrication cost.

Still others have attempted electrochemically plating a low temperature solder onto the metal pads of a receiving substrate card or board. The high temperature solder bumps installed on a semiconductor chip are then joined to the low temperature solder on the substrate or the board. The drawback of the process is that the electrochemical process which applies the low temperature solder bumps on the pads of the substrate is a very complicated process which involves various steps of seeding, photo processing, plating, etc. It is difficult to control the uniformity of the solder bump thickness and to prevent bridging problems from occurring between the bumps. The electrochemical plating process is also a high cost process.

It is therefore an object of the present invention to provide a method of forming interconnects on a semiconductor chip that does not have the drawbacks and shortcomings of the conventional methods.

It is another object of the present invention to provide a method of forming interconnects on a semiconductor chip such that the chip can be joined to a second electronic device in a low temperature bonding process.

It is a further object of the present invention to provide a method of forming interconnects on an electronic device by building interconnects with at least two different materials wherein a lower melting temperature material covers a higher melting temperature material.

It is another further object of the present invention to provide a method of forming interconnects on an electronic device by first forming a bump with a high melting temperature solder and then capping the bump with a low melting temperature solder.

It is yet another object of the present invention to provide a method of forming interconnects on an electronic device by first forming a low melting temperature solder in a mold and then transferring the molded solder onto high melting temperature solder bumps built on a semiconductor chip.

It is still another object of the present invention to provide a method of forming interconnects on an electronic device wherein a low melting temperature lead/tin solder is first formed in a mold and then transferred onto a high melting temperature lead/tin solder built on a semiconductor chip.

It is still another further object of the present invention to provide an electronic structure that has interconnects built on the structure with at least two different materials wherein one material which has a lower melting temperature substantially covers the other material which has a higher melting temperature.

SUMMARY OF THE INVENTION

In accordance with the present invention, a method of forming interconnects on an electronic device that can be bonded to another electronic device at a low processing temperature and a device made by such method are provided.

In a preferred embodiment, the method of forming interconnects on an electronic device can be carried out by depositing a first interconnect material on the electronic device forming protrusions and then depositing a second interconnect material to at least partially cover such protrusions, wherein the second interconnect material has a lower flow temperature than the first interconnect material. The method can be carried out by flowing a molten solder into a mold equipped with microcavities to fill the mold and then allowed to solidify. The mold is then aligned with a wafer consisting of chips deposited with high melting temperature solder bumps such that each microcavity of the mold is aligned with each high melting temperature solder bump on the chip. The aligned mold/wafer assembly is then passed through a reflow furnace to effect the transfer of the low melting temperature solder in the mold cavities onto the tip of the high melting temperature solder bumps on the wafer. A dual metallurgical composition bump formed of the two different solder alloys is therefore formed. The dual metallurgical composition bump allows for the chip to be bonded to a low temperature substrate such as an epoxy board or the like by a process in which only the tip of the bump containing the low melting temperature solder is molten to form a joint with the metal pad on the substrate board. The low melting temperature solder utilized has a melting temperature that is comparable with solders that are normally used on laminated cards or boards.

The present invention is further directed to an electronic structure that has interconnects deposited on a structure for making electrical connections, wherein the interconnects are formed of at least two different materials in intimate contact with each other where one material has a lower melting temperature and the other material has a higher melting temperature, the lower melting temperature material at least partially cover the higher melting temperature material in an area on the interconnect where electrical connection will be made. The solder material can be selected from a group of materials containing lead, tin, bismuth, molybdenum, silver, indium, antimony and polymeric based solder materials. It is desirable that the lower melting temperature material has a melting temperature that is at least 10° C. lower than the melting temperature of the higher melting temperature material.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention provides a method of forming an interconnect structure on an electronic device by building solder bumps with two different solder compositions and an electronic structure made by such method.

Figure 1:
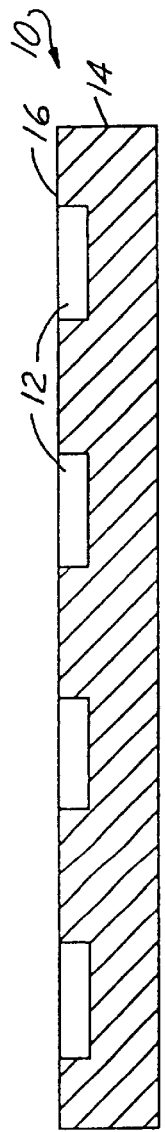
FIG. 1 is an enlarged, cross-sectional view of a mold apparatus for molding the low melting temperature solder.

Referring initially to FIG. 1, wherein an enlarged, cross-sectional view of a mold 10 having a mold body 14 and a plurality of cavities 12 as shown. The mold 10 can be constructed of a variety of different materials as long as two key requirements are met. First, the mold is preferred to be made of a transparent material in order to allow inspection of the solder fill quality and the initial alignment of the low melting temperature (or eutectic) solder in the mold cavities with the solder bumps on the wafer (or chip). Secondly, the coefficient of thermal expansion (CTE) should be sufficiently close to that of the silicon wafer, such that the wafer mold alignment can be maintained during reflow of the eutectic solder in the mold cavities onto the solder bumps on the wafer/chip. One example of a suitable material for the mold is a semi-transparent, low CTE polyimide film (of approximately 0.005" thickness) in which the mold cavities are created by the laser ablation or by the micropunching technique. The mold cavities 12 are subsequently filled with a low melting temperature solder (the eutectic solder) of the present invention. The solder-filled mold is then aligned with the solder bumps on the wafer/chip and pressure is applied by mechanical means to effect the transfer at a reflow temperature of the solder in the mold. After the transfer, the mold/wafer assembly is cooled to ambient temperature followed by the step of removing the mold from the wafer. Alternatively, the mold can be removed prior to the cooling of the assembly as soon as the solder transfer has been completed.

An alternate construction of the mold is a glass plate, in which blind holes are created by chemical etching of the glass through openings in a metal or photoresist film that is previously deposited and patterned on the glass plate. Reactive ion etching and laser ablation technique can also be used to create the cavities on the surface of the glass plate. After the cavities are etched in the glass, the thin film is removed from the surface.

In another alternate construction of the mold, the mold can be constructed of a combination of materials such as a polyimide film deposited on a glass plate. The deposition process can be carried out by spin coating, lamination or any other methods that is capable of applying a polyimide film which has a thickness comparable with the thickness of the molded solder. The polyimide film can be subsequently laser ablated through its thickness to the glass surface to form cavities. After a solder injection process, the low melting temperature solder can be transferred to the solder bumps on the wafer/chip in the previously described manner.

As shown in FIG. 1, the mold body 14 can be a glass plate having a thickness between about $\frac{1}{16}$" and about $\frac{1}{8}$". The glass composition of the mold is selected such that it has a coefficient of thermal expansion (CTE) similar to that of a silicon wafer to which the molded solder will be transferred. A suitable glass material to be used can be a borosilicate glass or a pyrex glass. For wafers of gallium arsenide (GaAs) instead of silicon, a suitable glass material to be used is a sodium lime glass which has a CTE close to that of gallium arsenide. The cavities 20, in a microscopic scale of approximately 80~100 $\mu$m in diameter are created in the top surface 16 of the glass body 14 by a chemical or physical etching process. In a chemical etching process, a metallic film or a photoresist is applied to a top surface 16 of the glass body 14 and then patterned by a standard photolithography process. The chemical etching process of the glass can be carried out in a hot KOH or $NH_4F$ solution. The microcavities 12 are thus created. Subsequently, the base metal or the photoresist film is removed and the mold fabrication is completed. In a physical etching process, a reactive ion etching method can be used by utilizing a metal mask in close contact with the surface 16 of the glass body 14. The mask can be made of a chromium metal or silicon having holes in locations corresponding to the locations of the cavities 12 shown in FIG. 1. The cavities 12 are created by exposing the glass body 14 to a reactive ion etching plasma through the mask.

Figure 2:
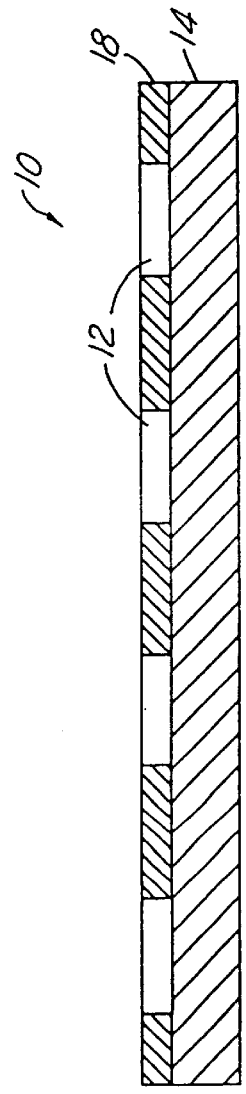
FIG. 2 is an enlarged, cross-sectional view of a composite mold constructed of polyimide and glass.

An alternate construction of a composite mold of polyimide/glass is shown in FIG. 2. A polyimide film 18 is first applied to the glass surface 16 by spin coating a polyimide fluid precursor on the surface 16 of the glass body 14 and then cured in an annealing process. Alternatively, a polyimide or other similar type of film can be laminated onto the glass body 14. A frequently used mold construction is a glass plate having a thickness between about 1/16" and about 1/8" thick made of a material described previously. The overall dimension for the glass body 14 matches the size of a silicon wafer that is usually of 5" or 8" in diameter. The polyimide film 18 deposited on the glass body 14 has a thickness between about 30 and about 50 μm. A preferred method of creating cavities 12 is by laser ablation through a metal mask directly onto the mold surface or by using a projection mask and the ablation procedure.

Figure 3:
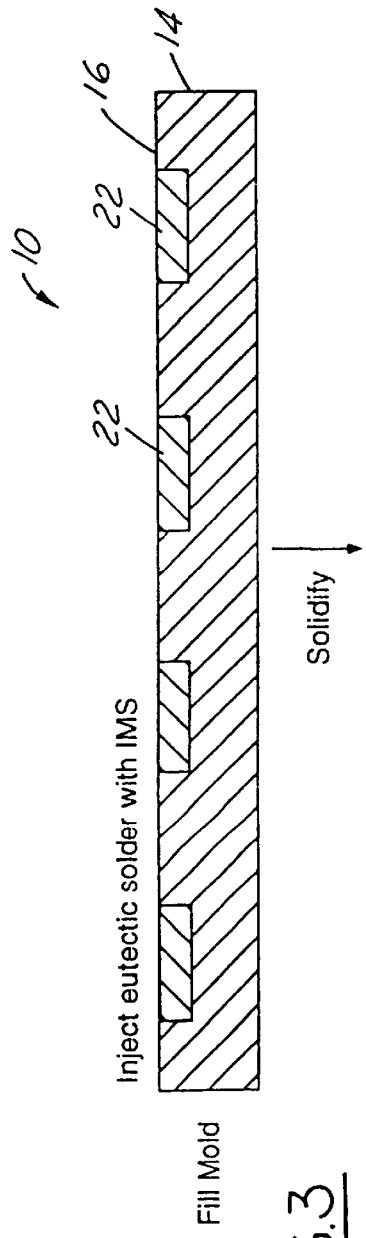
FIG. 3 is an enlarged, cross-sectional view of the mold in FIG. 1 filled with a solder material.

Referring now to FIG. 3, wherein the mold 10 in FIG. 1 is shown with the mold cavities 12 filled with a injection moldable solder 22 of a low melting temperature alloy. A typical low melting temperature alloy that can be suitably used is a lead/tin solder of 63 wt. % tin and 37 wt. % lead. In an injection molded solder process, a molten solder can be injected into tiny cavities by means of a injection tool which has a head containing solder in a liquid form and a vacuum/pressure system. When the injection head glides over the mold surface 16, the cavities 12 are filled with the molten solder. After the injection molded solder filling process, mold 10 is cooled to a temperature to allow the solder 22 to solidify in the mold cavities 12.

Figure 4:
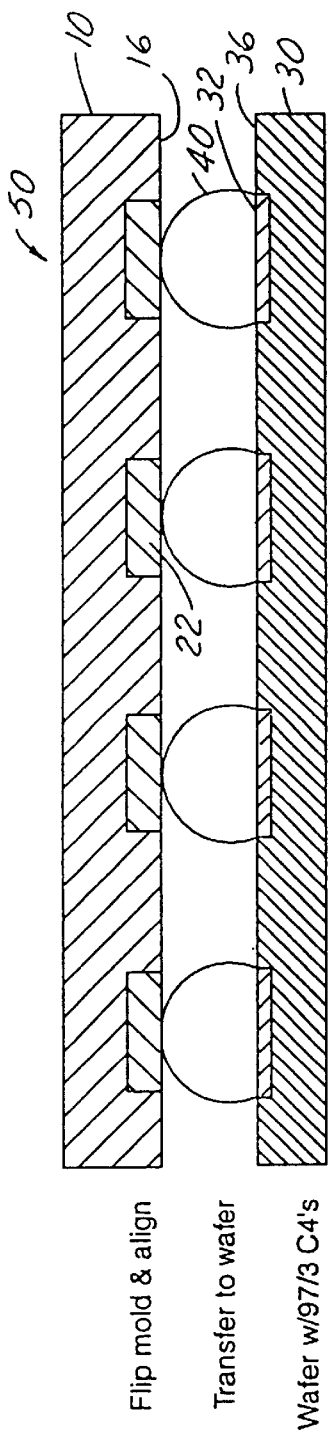
FIG. 4 is an enlarged, cross-sectional view of a mold/wafer assembly wherein the mold in FIG. 3 is flipped over on top of a wafer having high melting temperature solder bumps built thereon.

After the solder is solidified, the mold 10 is turned upside down and positioned in alignment with a silicon wafer (or chip) 30. This is shown in FIG. 4. The mold/wafer assembly 50 is shown in its aligned, pre-transfer state with the eutectic solder filled cavities 12 of mold body 14 aligned to the high melting temperature solder bumps 40 on the silicon wafer 30. The alignment procedure can be greatly facilitated by the transparency of the mold and by a visual contrast between the glass and the solidified solder in the cavities 12. The optical contrast allows for a quality inspection of all solder filled cavities in the mold to verify the fill completion and quality prior to the alignment procedure. After the verification, mold body 14 is flipped over and aligned with the silicon wafer 30. Before the alignment procedure, a small amount of a flux may optionally be applied to the mold surface 16 and the eutectic solder 22 in the cavities in order to improve the wetting characteristics during the solder transfer process and to prevent the oxidation of the transferred solder. The flux may be applied by selectively spraying onto the eutectic solder in the mold cavities by a mask. The flux can be one of a number of known flux compositions commercially available and, preferably those of a water soluble nature or of the "no clean" classification. The mold 10 and the silicon wafer 30 can be precisely aligned such that the solder bumps 40 are positioned against the eutectic solders 22 of mold 10, when the mold is transparent in the case of a glass mold or semi-transparent in the case of a polyimide/glass mold.

After the alignment procedure is completed, and during the transfer process, the mold 10 and the wafer 30 can be locked in a fixed position by using any mechanical means. A differential pressure can be achieved by including a compliant base material in a clamp assembly such that an improved contact is achieved across the entire wafer/mold interface. A typical compliant material can be used is a high temperature polymer foam which compresses under pressure and has sufficient elasticity to return to its original dimension after the pressure is removed.

Figure 5:
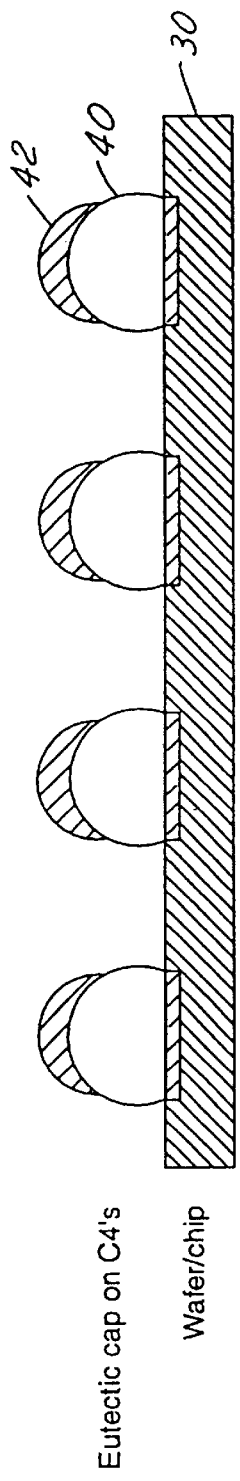
FIG. 5 is an enlarged, cross-sectional view of the wafer/chip in FIG. 4 showing the low temperature solder capping the high temperature solder bumps.

The transfer of solder 22 from mold body 10 to the high melting temperature solder bumps 40 on wafer 34, as shown in FIG. 4, can be performed by passing the mold/wafer assembly 50 after the fluxing, alignment and clamping process through a reflow furnace. It is recommended that hydrogen, nitrogen or a forming gas to be used to purge through the furnace at a temperature between about 200° C. and about 300° C. The temperature ramp-up rate and dwell times are typical of those used in conventional reflow process. Under these processing conditions, the eutectic solder 22 in the cavities 12 melt and leaves the mold body 14 and transfer onto the top of solder bumps 40 and then solidifies to form a low melting temperature cap 42 on top of the solder bumps 40. This is shown in FIG. 5. The solder bumps 40 shown in FIG. 4 and have a significantly higher melting temperature (i.e., about 320° C.) and therefore their structure and shape are not affected by the solder transfer process. This permits the semiconductor chips obtained by the present invention procedure to retain its inherent reliability of the original fabricated device.

FIG. 5 shows an enlarged, cross-sectional view of a wafer 30 having a number of solder bumps 40 deposited on top and a cap layer 42 of low melting temperature solder deposited by a transfer process. The resulting bump configuration achieved by the present invention shown in FIG. 5 consists of a dual metallurgical structure which on one hand maintains the high reliability and electrical/mechanical properties of a high melting temperature solder and on the other hand, allows wafer/chip 30 to be bonded at a lower bonding temperature by joining to a substrate 60. This is shown in FIG. 6.

An advantage made possible by the present invention method is that the amount of the eutectic solder and the volume required are limited for forming a cap (or layer) on top of the high melting temperature solder. It is made possible by the present invention method by providing eutectic solder volume of the cap 42 (shown in FIG. 5) to be only approximately ¼ of the total volume of the solder bump 40. The conditions for the transfer process can be suitably adjusted such that the molten eutectic solder does not run down to the bottom of the solder bump 40 to avoid an undesirable reaction between the eutectic solder which has a high tin content with the interface 62 and consequently affecting the electrical reliability of the wafer/chip 30.

Figure 6:
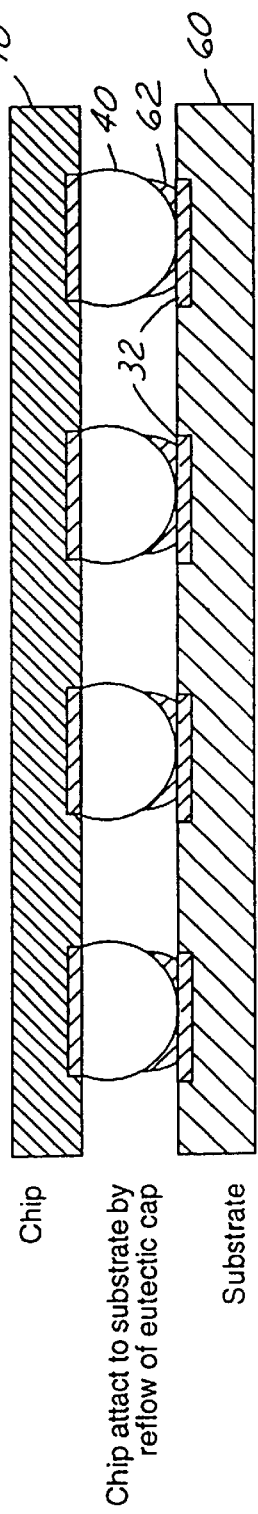
FIG. 6 is an enlarged, cross-sectional view of the wafer/chip in FIG. 5 bonded to a substrate having bonding pads.

A chip/substrate assembly 80 prepared by the present invention low temperature chip attachment method is shown in FIG. 6. An semiconductor chip 70 which is diced from a wafer on which the eutectic cap transfer process of the present invention was carried out is joined to a substrate 60. The substrate 60 can be of any polymeric substrate utilized in the printed circuit board technology, for instance, epoxy boards or the like. The joining process can be carried out by fluxing the bonding pads on the boards or cards using conventional flux procedures to prevent oxidation and to enhance the wetting of the metal pads by the low melting temperature solder. As shown in FIG. 6, the joint of the bump/card interface 62 has a unique configuration which is formed by a layer of molten eutectic solder between the substrate bonding pads 32 (usually of copper or gold) and the high melting temperature solder bump 40. The high melting temperature solder bump 40 does not normally involve in the joining process.

The present invention method can be applied to substrates other than silicon wafers, i.e., to GaAs substrates for the packing of electronic chips such as CMOS and other logic and memory products which utilize high melting temperature bump termination and require a low temperature chip attachment method. The present invention method can also be applied in a flip chip attachment to other substrates such as ceramic and the like.

The present invention low melting temperature solder (or the eutectic solder) composition can be suitably selected from a number of alloy compositions. For instance, a lead/tin alloy can be suitably used with a lead content between about 22% and about 52% by wt, and a tin content of between about 48% and about 78% by wt. A more preferred composition is between about 27% by wt. and about 47% by wt. lead, and between about 53% by wt. and about 73% by wt. tin. One suitable example is about 37% by wt. lead and 63% by wt. tin. The eutectic solder composition can also be made of a two component tin alloy. For instance, a tin/bismuth, tin/silver, tin/indium and tin/antimony alloy. A proper percentage of tin in these alloys can be from about 85% to about 98% by wt, and the percentage of the alloying element of bismuth, silver, indium, and antimony can be between about 3 and about 15% by wt. A three component alloy composition of tin/bismuth/indium can also be used which contains approximately between about 85 and about 95% by wt tin, between about 2 and about 7% by wt bismuth, and between about 2 and about 8% by wt indium. The composition of the high melting temperature solder bump can be a lead/tin alloy containing between about 90% and about 97% by wt. lead and between about 3% and about 10% by wt. tin.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. A method of forming solder bumps on a semiconductor device comprising the steps of:
   depositing a first solder material on the device,
   forming a second solder material having a lower flow temperature than the first solder material, and
   transferring all said second solder material to at least partially cover an area of the first solder material to be bonded to a second electronic device.

2. A method according to claim 1, wherein said second solder material having a flow temperature that is at last 10° C. lower than the flow temperature of said first solder material.

3. A method according to claim 1, wherein said first and said second solder materials comprise more than 30% by weight of lead.

4. A method according to claim 1, wherein said first and said second solder materials are metal alloys containing at least two metals.

5. A method according to claim 1, wherein said first and said second solder materials are selected from the group consisting of lead, tin, bismuth, silver, molybdenum, indium and antimony.

6. A method of forming solder bumps according to claim 1, wherein said first solder material are deposited into solder bumps.

7. A method of forming solder bumps according to claim 1, wherein said first solder material is made of a metal alloys or polymeric based conductive materials.

8. A method of forming solder bumps according to claim 1, further comprising the step of electrically joining said device to a second electronic device by said solder bumps.

9. A method of forming solder bumps according to claim 1, wherein the joining of said device with a second electrical device is established substantially by flowing said second solder material between said two devices.

10. A method of forming solder bumps according to claim 1, wherein said device is electrically joined to bonding pads positioned on said second electrical device.

11. A method of forming solder bumps according to claim 1, wherein said first and said second solder materials comprise lead.

12. A method of forming solder bumps according to claim 1, wherein said first and said second solder materials comprise at least 30% by weight lead and less than 70% by weight tin.

13. A method of electrically joining a first and a second electronic device together comprising the steps of:
   depositing a first solder material on a top surface of the first electronic device forming protrusions,
   molding a second solder material in a mold,
   transferring all said second solder material having a lower flow temperature than the first solder material to at least partially cover the top of the protrusions,
   pressing said first electronic device against said second electronic device with said protrusions contacting a surface of said second electronic device to be joined under a pressure and a temperature that is sufficient to cause a flow in said second solder material to electrically joining the two devices.

14. A method according to claim 13, wherein said second solder material having a lower melting temperature than said first solder material.

15. A method according to claim 13, wherein said pressure is between about 1 psi and about 10 psi, and said temperature is between about 180° C. and about 230° C.

16. A method according to claim 13, wherein said first electronic device is a semiconductor chip and said second electronic device is a substrate.

17. A method according to claim 13, wherein said second solder material has a melting temperature that is at least 10° C. lower than that of the first solder material.

18. A method according to claim 13, wherein said first and second solder materials are metal alloys comprising lead.

* * * * *